United States Patent [19]

Owens et al.

[11] Patent Number: 4,931,380
[45] Date of Patent: Jun. 5, 1990

[54] PRE-EXPOSURE METHOD FOR INCREASED SENSITIVITY IN HIGH CONTRAST RESIST DEVELOPMENT OF POSITIVE WORKING DIAZO KETONE PHOTORESIST

[75] Inventors: Robert A. Owens, E. Amherst; Roland L. Chin, Williamsville; Susan A. Ferguson, W. Seneca; James M. Lewis, Williamsville, all of N.Y.

[73] Assignee: MicroSi, Inc., Phoenix, Ariz.

[21] Appl. No.: 274,648

[22] Filed: Nov. 18, 1988

Related U.S. Application Data

[63] Continuation of Ser. No. 65,680, Jun. 18, 1987, abandoned, which is a continuation of Ser. No. 756,205, Jul. 18, 1985, abandoned.

[51] Int. Cl.$^5$ .............................. G03F 7/26
[52] U.S. Cl. ..................... 430/296; 430/326; 430/327; 430/328; 430/494
[58] Field of Search ............... 430/326, 327, 328, 296, 430/494

[56] References Cited

U.S. PATENT DOCUMENTS

| | | | |
|---|---|---|---|
| 3,144,331 | 8/1964 | Thommes | 430/494 |
| 3,519,425 | 7/1970 | Marshall et al. | 430/152 |
| 3,852,771 | 12/1974 | Ross et al. | 430/296 |
| 3,961,100 | 6/1976 | Harris et al. | 430/296 |
| 4,250,242 | 2/1981 | Doering et al. | 430/327 |
| 4,291,118 | 9/1981 | Boduch et al. | 430/494 |
| 4,356,254 | 10/1982 | Takahashi et al. | 430/296 |
| 4,359,520 | 11/1982 | Carothers et al. | 430/296 |
| 4,403,151 | 9/1983 | Mochiji et al. | 430/296 |
| 4,544,627 | 10/1985 | Takahashi et al. | 430/296 |
| 4,576,892 | 3/1986 | Golda et al. | 430/327 |

FOREIGN PATENT DOCUMENTS 55-41785  3/1980  Japan ................................. 430/296

OTHER PUBLICATIONS

Daetwyler, K. et al., *IBM Tech. Disclosure Bulletin*, vol. 26, No. 11, 4/1984, p. 5824.
Fredericks, E. C., *IBM Tech. Disclosure Bulletin*, vol. 21, No. 7, 12/1978, p. 2824.
Berker, T., et al., *IEEE Electron Device Letters*, EDL-2, No. 11, 11/1981, pp. 281-283.
Lin, B. J., *J. Vac. Sci Technol.*, 16(6), 11/12-1979, pp. 1669-1671.
Gillespie, S. J., *IBM Tech. Disclosure Bulletin*, vol. 26, No. 12, 5/1984, p. 6246.

*Primary Examiner*—Charles L. Bowers, Jr.
*Attorney, Agent, or Firm*—Davis Hoxie Faithfull & Hapgood

[57] ABSTRACT

A high contrast developing process is described for use after pre-exposure to UV-visible radiation to produce increased sensitivity during lithographic processing of positive resist layers. Compared to samples which have not been subjected to the methods of this invention, sensitivity increases of a factor of 2-4 are to be expected. An additional benefit of low film loss from unexposed resist is obtained. The system disclosed is applicable to lithographic exposures utilizing electrons, photon (e.g. UV-visible, x-rays, etc.) and atomic or molecular charged particles. Specifically, as a result of the increased sensitivity, higher throughput during lithographic processing for the fabrication of photomasks and semiconductor devices is realized.

7 Claims, 1 Drawing Sheet

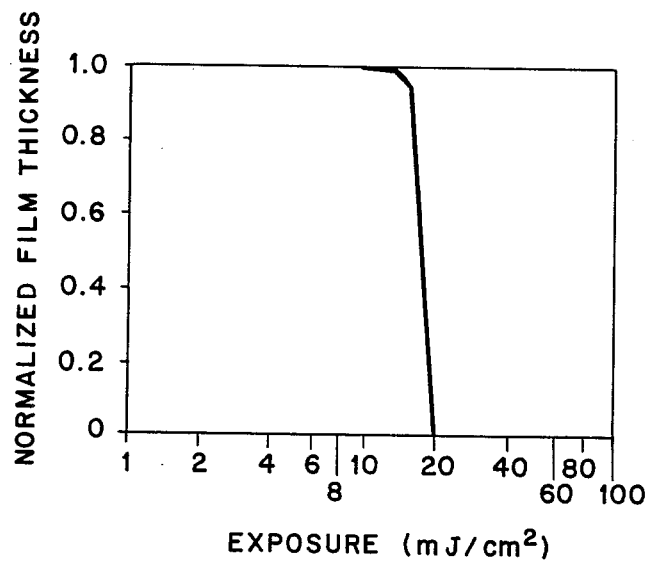

PRE-EXPOSURE METHOD FOR INCREASED SENSITIVITY IN HIGH CONTRAST RESIST DEVELOPMENT OF POSITIVE WORKING DIAZO KETONE PHOTORESIST

This application is a continuation of application Ser. No. 065,680, filed June 18, 1987, abandoned, which is a continuation of Ser. No. 756,205, filed July 18, 1985, now abandoned.

FIELD OF THE INVENTION

This invention relates to a developing process for high contrast resists and more particularly to the use of a high contrast resist developer after there has been a pre-exposure of the resist to UV-visible radiation, to produce increased sensitivity during lithographic processing of positive resist layers. In comparison to resist layers which have not been subjected to the method of the present invention, sensitivity increases, employing the method of the invention are 2–4 times higher. Moreover, when used with a commerical photoresist system, the photoresist and developer combination* provided the additional benefit of low film loss from unexposed resist.

\* An illustrative photoresist system being, for example, a novolac type photoresist, available commercially as ACCULITH™ P-6010 (now known as MicroSi® M.S. 6010) with a potassium hydroxide type developer, availabe as MicroSi® DV-4300, from Hüls America, Inc.

This invention is applicable to lithographic exposures utilizing electrons, photons (eg. UV-visible, x-rays, etc.) and ions, i.e., atomic or molecular charged particles. Specifically, as a result of the increased sensitivity, higher throughput during lithographic processing for the fabrication of photomasks and semiconductor devices is realized.

BACKGROUND OF THE INVENTION

Pattern definition for the production of semiconductor devices and photomasks is accomplished through the use of materials called resists. Resists which are typically organic polymers undergo a change is solubility response to a developer solution upon exposure to an irradiation source such as UV-visibile light, x-rays or a beam of charged particles. By definition, if the exposed areas attain a higher dissolution rate relative to the unexposed areas, the resist is referred to as positive acting.

Most positive resists are produced from the combination of three basic ingredients: a resin, a photosensitive compound (sensitizer) and the solvent system. It is the role of the sensitizer to provide the resist its ability to withstand dissolution in the developer system. However, upon exposure to an irradiation source, the sensitizer is chemically transformed to a developer-soluble material. The net effect is that the dissolution rate of the exposed areas is greatly increased. However, the difference in dissolution rates between exposed and unexposed domains of the resist is only relative i.e. the unexposed resist may dissolve to some extent in the developer. For practical working resists, the differential solubility should be a factor of about 30 or greater i.e. film loss from unexposed resist should be less than 3%. The change in the differential solubility is not, however, a continuously linear function of exposure dose. Rather, at low exposures the dissolution rates between exposed and unexposed areas of a resist are not too dissimilar. As the dose is increased, a threshold value is reached where the dissolution rate increases sharply. Optimum exposure corresponds to the minimum dose which allows complete removal of exposed resist for a predetermined set of processing conditions. To quantify differences among resists, the term sensitivity may be defined as the minimum radiation dose which provides the desired ratio for the rate of dissolution between exposed and unexposed portions of the resist for a given set of parameters.

In the fabrication of semiconductor devices and photomasks, it is advantageous to use a resist of highest sensitivity (minimum exposure time) in order to maximize throughput. This premise applies to any lithographic procedure irrespective of the irradiation source but is particularly important for direct write operations utilizing charged particles (e.g. electrons and ions). Currently, the chief impediment to the employment of these techniques as routine processing operations is their limited throughput. This limitation is especially severe for electron beam lithography which is cost prohibitive compared to the more commonly used UV-visible photolithography. Exceptions are those special applications which require geometries not attainable by the optical techniques. Moreover, it is anticipated that future need for smaller geometries will not be within the capabilities of photolithography to faithfully print the required details. Hence, electron and ion beam lithography are attractive alternatives to meet future needs. This realization has stimulated much research into these lithographic methods with particular emphasis on improving the sensitivity of existing resists and/or development of new resist systems.

Accordingly, a need is present for a method which would obviate the disadvantage of low throughput due to limited sensitivity. Attempts to improve the sensitivity of electron beam resists have focused on the development of novel systems. Pre-exposure of a commercial photoresist with monochromatic light from an argon laser is reported for the recording of holograms as described by Beesley and Castledine, *Applied Optics*, vol. 9, 1970, pp. 2720–2724. However, values relating to film loss from unexposed resists are not known to have been considered in that reported study. In any event, it has not been known prior to any discovery that pre-exposure may be usefully applied to electron beam or optical developing techniques in the manner and for the particular purpose presented by this invention.

SUMMARY OF THE INVENTION

In accordance with the invention, a method is described which inproves the sensitivity of positive resists for lithographic processing. The method utilizes initial pre-exposure of the resist to UV and/or visible light and subsequent development with a high contrast developer after lithographic exposure to form the desired image. We have discovered that by employing the combination of resist/developer and pre-exposure dose controlled in the manner of the invention, film loss is negligible; enhancements in sensitivities were estimated for lithographies employing UV/visible and electrons as the irradiation source.

BRIEF DESCRIPTION OF THE DRAWING

The curve shown in the drawing illustrates the relationship between normalized film thickness of exposed resist as a function of UV/visible exposure dose for a given photoresist and developer system.

DESCRIPTION OF THE PREFERRED EMBODIMENT

In accordance with the invention, a method is described that improves the sensitivity of resists to lithographic processing. Specifically, this improvement is derived from pre-exposure of the resist to UV and/or visible radiation from an appropriate source and development of the desired image using a high contrast developer. A significant feature of this invention is that film loss is reduced to a negligible value for unexposed resist.

In the practice of the invention, we have discovered that optimum results are obtained only after certain requisites are met. The resist must be photoactive to UV and/or visible radiation, i.e., an increase in solubility response must occur upon exposure. This requirement is characteristic of all known commerical positive photoresists although the feasibility as an electron beam resist for a given photoresist must be evaluated in the light of the task at hand. Additionally, the onset of this solubility response should be negligible at low exposure doses, desirably at zero, and should increase sharply at some threshold value. Of equal importance are the properties of the developer since it in combination with the resist, determines the sensitivity and contrast of the system.

Positive resists containing sensitizer of the diazo ketone type where the diazo and keto groups are at adjacent positions on the molecule have been found suitable for this invention. Examples of these sensitizers are guinone-diazide sulfonic acid derivatives as described, for example, in U.S. Pat. Nos. 2,958,599; 3,046,110; 3,046,114; 3,046,116; 3,046,118; 3,046,119; 3,046,121; 3,046,122; 3,046,123; 3,106,465; 3,148,983; 3,635,709; 3,711,285; and 4,174,222 which the disclosed sensitizers are incorporated by reference in the present system.

The developer, of which potassium hydroxide, sodium hydroxide and sodium silicate are typical, must be capable of providing high contrast. For aqueous alkali metal base, such as those used in positive photoresist containing an alkali-soluble resin, this is usually accomplished by the addition of a carboxylated surfactant to the developer as described in U.S. Pat. No. 4,670,372, issued June 2, 1987. For the above developer contrast values of 3–7 are possible without the attendant film loss found in other systems. These features are very desirable in attaining maximum sensitivities as described by the invention herein.

The resist may be applied to the substrate in the conventional manner as known by one skilled in the art. In most situations, this is accomplished by spincoating to a desired thickness although other methods of application may be employed. Subsequent processing steps are generally identical to those used in the normal preparation of the coated substrate prior to lithographic exposure.

Pre-exposure which immediately precedes lithographic exposure constituents flooding of the coated substrate with UV and/or visible radiation from an appropriate source. The irradiation source should be capable of providing a stable and uniform illumination over the entire substrate surface. Additionally, it is desirable that the source be of sufficient intensity to minimize exposure time for a given radiation dose; hence, increasing throughput. Mercury arc lamps, as found in most optical lithographic machines, are quite adequate for this purpose. Although a tungsten filament incandescent lamp may also be used, it is less desirable than the mercury arc lamp due to a lower efficiency in the production of UV radiation.

Optimum pre-exposure dose will be dictated by the particular resist/developer combination to be used since the optical absorption characteristics and solubility responses will vary among different systems. Moreover, developing conditions (e.g. time and temperature) are additional factors to be considered in the selection of the irradiation dose. For one skilled in the art of lithographic processing, the determination of optimum pre-exposure dose of the film short of significant film loss for a given set of conditions is a relatively routine task.

This determination of the optimum pre-exposure dose is illustrated by reference to the drawing for a positive type photoresist[1] and its companion developer, DV-4300[2]. Commonly referred to an a contrast curve, the graph is a plot of the normalized resist film thickness as a function of exposure dose from a mercury arc lamp. The processing conditions for the P-6010/D-360 system are as follows:

| | |
|---|---|
| soft bake method: | convection oven |
| soft bake temperature: | 90° C. |
| soft bake time: | 30 minutes |
| resist thickness: | 1 um |
| develop method: | static dip |
| develop temperature: | 22° C. |
| develop time: | 60 seconds |

[1] Available commercially as ACCULITH P-6010, now marketed as MicroSi ® M.S. 6010.
[2] Potassium hydroxide based developer available commercially from Hüls America, Inc.

Film loss for a particular exposure dose is easily calculated by multiplying the original film thickness times the normalized film thickness. It is evident from the graph of the drawing that in order to completely remove the resist under the above conditions, a total exposure dose of 20 mJ/cm$^2$ is necessary. Exposures up to ca. 10 mJ/cm$^2$ result in no dissolution of the original film, i.e. zero film loss. The optimum pre-exposure dose would correspond to the maximum exposure before the film is solublized by the exposure, i.e., before any significant film loss is encountered. The pre-exposure should not result in more than about 3–5 percent film loss and preferably substantially zero film loss. Therefore, lithographic exposure would be decreased by the amount equivalent to the pre-exposure dose for optical lithography. The situation may not necessarily hold for electron beam lithography, since activation of the sensitizer by electrons would not be expected to occur with the same effeciency as for photons. In fact, pre-exposure resulted in greater sensitivity enhancement for electron beam exposure than for UV/visible radiation exposure.

The invention is further described by reference to the following examples. The enumeration of details in the examples should not be interpreted as limitations except as may be expressed in the appended claims.

EXPERIMENTAL METHOD

The resist/developer system used in the examples described below in AccuLith ® P-6010 photoresist which is a positive acting diazo ketone/novolac resin photoresist and AccuLith TM D-360 developer which is a KOH based developer. This system was chosen due to its high contrast which results in zero film loss under optimum processing conditions. The resist was applied to clean silicon wafer by spin-coating so as to produce a 1 micrometer thick film. To aid in the adhesion of the resist to the substrate, the wafers were exposed to hexamethyldisilazane vapors for 10 minutes in a closed container prior to coating. The coated wafers were subsequently heated in a forced air convection oven for 30 minutes at 90° C. to drive off residual solvents.

The pre-exposure was effected by the illumination of the coated wafer surface with radiation from a mercury arc lamp for a present duration corresponding to a known dose. This pre-exposure dose was measured by means of a UV light intensity meter manufactured by Optical Associates Incorporated. Lithographic exposure, both optical and electron beam, immediately followed. Development of the lithographic pattern was performed at 22° C. for a desired length of time using the static immersion method. Film loss from unexposed resist was measured by interferometry.

EXAMPLE I (comparative)

A coated substrate was prepared as described by the above procedure. The wafer was exposed to UV radiation through an Opto-Line step tablet resolution mask with windows of various exposure levels on the same wafer. A minimum exposure dose of 20 mJ/cm$^2$ was required to completely develop the resist at 22° C. and 1 minute development time. Film loss was determined to be zero with a constrast value (gamma) of 6.

EXAMPLE II

The experiment of Example I was repeated but with pre-exposure included in the processing sequence. Prior to lithographic exposure, the coated wafer was flood exposed to 10 mJ/cm$^2$ of UV/visible radiation as described above. Complete dissolution of the exposed resist required 10 mJ/cm$^2$ of lithographic exposure with zero film loss and a gamma of 3.

EXAMPLE III (comparative)

Electron beam exposure was performed with an unmodified Perkin-Elmer Autoscan microscope under manual control. An acceleration voltage of 20 KeV was employed at a beam current of 6nA. The raster pattern of the electron beam was roughly that of a square with a length of ca. 20 micrometers on each side at a magification of 3000X and a working distance of 12 mm; however, exposure across the raster area was nonuniform. Relative changes in sensitivity were evaluated by comparison of the minimum exposure times required to completely clean the electron beam generated pattern.

As described above, a coated wafer was prepared and exposed to the electron beam for 60 seconds. After a 60 second development in D-360, an underdeveloped pattern was gathered as viewed through a scanning electron microscope. No film loss resulted from the unexposed resist.

EXAMPLE IV

The experiment described in Example III was repeated with the inclusion of pre-exposure. Immediately before electron beam processing, the coated wafer was flood exposure to a dose of 8.2 mJ/cm$^2$ from a mercury arc lamp. A pattern similar to that produced in Example III was obtained after less than 30 seconds of electron beam exposure. No measureable film loss was observed illustrating the beneficial effect of the pre-exposure.

EXAMPLE V

The experiment described in III was repeated but with the pre-exposure dose increased to 12.5 mJ/cm$^2$. A pattern similar to that obtained in Example III resulted after exposure to the electron beam for 15 seconds. Film loss was ca. 1%. This run again illustrates the beneficial effect of pre-exposing the photosensitive film prior to the normal exposure.

The invention may be applied in conjunction with various exposure systems known in the art, including exposure to electrons, photons, e.g., UV-visible radiation, ionic particles, i.e., atomic or molecular charged particles, and the like.

It will be understood that various modifications may be made to the details presented in the system of the invention without departing from the invention. The invention, therefore, is not to be limited by such details except as set forth in the claims which follow.

What is claimed:

1. A process for developing a positive photoresist pattern in an ultraviolet (UV) or visible radiation sensitive diazo ketone/novalac resin photoresist, in a high contrast system, wherein the photoresist comprises a continuous coating on the surface of a supporting substrate, the process comprising:

flood exposing the coating, over the area which is to receive the positive photoresist pattern, with a first predetermined amount of radiation in the UV or visible range or a combination thereof, said first predetermined amount of radiation being insufficient alone to produce more than about 5% film loss with subsequent development of the photoresist;

pattern exposing the coating, over the area which is to receive the positive photoresist pattern, with a second predetermined amount of radiation in the UV or visible range or by electron beam, to form a latent image of the pattern in the photoresist, said second predetermined amount of radiation being insufficient alone to produce more than about 5% film loss with subsequent development of the photoresist, said first and second predetermined amounts of radiation being applied to the coating directly, rather than indirectly via any uncoated surface of the substrate, with the proviso that said first and second predetermined amounts of radiation cumulatively are sufficient to produce significant film loss, and thereby a positive image, in areas irradiation by both said first and second predetermined amounts of radiation; and thereafter developing the photoresist to remove areas exposed to both said first and second predetermined amounts of radiation with a high contrast aqueous alkaline developer to thereby produce a positive pattern image.

2. The process of claim 1 wherein the photoresist is flood exposed to combined ultraviolet and visible radiation.

3. The process of claim 1 wherein the photoresist is first flood exposed, and thereafter the photoresist is pattern exposed by electron beam radiation.

4. The process of claim 1 wherein the flood exposure is effected by UV and/or visible radiation, and thereafter the pattern exposure is effected by UV/visible radiation, X-ray or electron beam.

5. The process of claim 1 wherein the developer comprises potassium hydroxide.

6. The process of claim 1 wherein the developer comprises sodium hydroxide.

7. The process of claim 1 wherein the developer comprises sodium silicate.

* * * * *

UNITED STATES PATENT AND TRADEMARK OFFICE
CERTIFICATE OF CORRECTION

PATENT NO. : 4,931,380

DATED : June 5, 1990

INVENTOR(S) : Owens et al.

It is certified that error appears in the above-identified patent and that said Letters Patent is hereby corrected as shown below:

Col. 1, line 40, change "is" to --in--.

Col. 5, line 51, change "gathered" to --generated--.

Signed and Sealed this

Seventeenth Day of September, 1991

*Attest:*

HARRY F. MANBECK, JR.

*Attesting Officer*     *Commissioner of Patents and Trademarks*